United States Patent [19]

Bosch

[11] Patent Number: 4,922,480
[45] Date of Patent: May 1, 1990

[54] TECHNIQUE FOR IMPROVING THE PERCENTAGE OF SEMICONDUCTOR LASERS USABLE WITH A PREDETERMINED WAVELENGTH SPECIFICATION

[75] Inventor: Fridolin L. Bosch, Bethlehem, Pa.

[73] Assignee: American Telephone and Telegraph Company, New York, N.Y.

[21] Appl. No.: 127,843

[22] Filed: Dec. 2, 1987

[51] Int. Cl.⁵ .............................................. H04B 9/00
[52] U.S. Cl. ..................................... 370/3; 455/613; 455/618
[58] Field of Search ............... 455/606, 607, 609, 613, 455/617, 618; 370/3

[56] References Cited

U.S. PATENT DOCUMENTS

| | | | |
|---|---|---|---|
| 4,309,671 | 1/1982 | Malyon | 331/94.5 |
| 4,485,475 | 11/1984 | Large et al. | 455/609 |
| 4,631,728 | 12/1986 | Simons | 372/38 |
| 4,639,075 | 1/1987 | Salour | 455/609 |
| 4,715,028 | 12/1987 | McMahon et al. | 370/3 |
| 4,722,081 | 1/1988 | Fujito et al. | 370/3 |
| 4,745,592 | 5/1988 | Gabriagues | 455/607 |

OTHER PUBLICATIONS

"A Temperature Compensated Laser Module for Optical Communications", Ettenberg et al, RCA Review, vol. 40, 6-79, pp. 103-114.
"Field Measurements Set for Attenuation and Bandwidth of Optical Links", Auffret et al, Electronic Letters, vol. 16, #21, pp. 798-799, 10-9-80.

Primary Examiner—Robert L. Griffin
Assistant Examiner—L. Van Beek
Attorney, Agent, or Firm—Wendy W. Koba

[57] ABSTRACT

A technique for increasing the number of manufactured laser transmitters which meet a predetermined wavelength specification is disclosed. Semiconductor lasers which exhibit a relationship between operating temperature and wavelength can be tuned by adjusting the operating temperature to ensure that the transmitter's operating wavelength will fall within the system-specified limits.

6 Claims, 1 Drawing Sheet

TECHNIQUE FOR IMPROVING THE PERCENTAGE OF SEMICONDUCTOR LASERS USABLE WITH A PREDETERMINED WAVELENGTH SPECIFICATION

BACKGROUND OF THE INVENTION

This invention relates to a novel technique for increasing the number of semiconductor laser transmitters which meet a predefined wavelength specification and more particularly to a technique for changing a laser's center wavelength by adjusting its operating temperature.

Most laser-based communication systems have an associated range of acceptable operating wavelengths. That is, the system designers will specify a given wavelength of $\lambda_o$ as the center wavelength, with an acceptable range of $\pm\Delta\lambda$. In many cases, as higher and higher bit rate systems are employed (for example, >1 Gb/s), the acceptable wavelength range about the center wavelength becomes increasingly smaller. This system specification is passed on to device designers and/or manufacturers who must supply lasers which satisfy the criterion at the lowest cost possible. For example, a particular high bit rate laser-based transmission system may require 1.3 $\mu$m InGaAsP lasers having a center wavelength of 1308 nm, with a range of $\pm 4$ nm.

Because lasers as manufactured obviously have a distribution of wavelengths, a narrow system specification profoundly affects the number of manufactured devices which may be used in the system. In an exemplary manufacturing operation, perhaps less thn 25% of the manufactured lasers may meet the required wavelength specification. Although manufactured lasers which exhibit a transmitting wavelength outside of the predetermined range may be used in other applications with different wavelength requirements, the majority are often discarded as scrap. This large percentage of scrap, coupled with the cost of manufacturing lasers, leads to a significant premium in expense which must be added to the cost of the acceptable lasers. Thus, it would be desirable to increase the number of lasers which satisfy a particular wavelength specifications.

Many systems exist in the prior art for controlling the operating wavelength of a laser once the system has been installed. One exemplary arrangement is disclosed in U.S. Pat. No. 4,485,475 issued to S. F. Large et al on Nov. 27, 1984. Large et al utilizes a combination of a GRIN lens and diffraction grating to monitor the drift of a laser's output wavelength. As the output drifts beyond $\pm\Delta\lambda$, a drift detector sends a control signal to a thermoelectric cooler which either raises or lowers the laser temperature to drive the wavelength back within the defined range. Such dynamic wavelength control arrangements, however, are utilized only with installed lasers which meet the wavelength specification.

Thermoelectric coolers are also utilized with laser transmitters to maintain a constant laser operating temperature, 20° C. being a conventional operating temperature. In some applications, the ambient temperature may range anywhere from $-50°$ C. to $+100°$ C., yet the thermoelectric cooler must maintain the laser at 20° C. with minimal variation (e.g., $\pm 0.5°$ C.). The laser itself may generate a head load on the order of 80-100 milliwatts which must also be absorbed by the thermoelectric cooler. U.S. Pat. No. 4,631,728 issued to B. S. Simons on Dec. 28, 1986 discloses an exemplary circuit arrangement for monitoring the laser's temperature and controlling the response of the thermoelectric cooler. The Simons circuit purports to exhibit improved efficiency, necessary for laser-based systems, over prior art arrangements by utilizing a pulse width modulated controller, switching transistor and network filter to supply the load current to the thermoelectric cooler.

Neither the Large et al. nor Simons arrangements, however, address the problem described above of finding a means of increasing the percentage of manufactured lasers which meet a given wavelength specification. Large et al. merely controls the operating wavelength after a laser (which presumably meets the required wavelength specification) is, installed. Simons maintains an installed laser at a predetermined operating temperature, regardless of the ambient temperature.

Thus, a need remains for a method of increasing the number of system-acceptable lasers without sacrificing the required specifications, in particular the wavelength specification.

SUMMARY OF THE INVENTION

The problem remaining in the prior art is addressed by the present invention which relates to a technique for increasing the percentage yield of fabricated laser transmitters which meet a predefined wavelength specification.

An aspect of the present invention is to improve the present yield statistics for lasers utilized in high bit rate communication systems to a level well exceeding the nominal 25% value.

Another aspect of the present inention is to provide for a tighter control of the laser operating wavelength so that a larger number of lasers may be utilized simultaneously in a single transmission system, for example, in a wavelength-division multiplexed (WDM) system.

These and other aspects are achieved in accordance with the present invention by the separate and independent control of each laser's operating temperature so as to insure that the laser's operating wavelength is within the system wavelength specification. In accordance with the present technique, a laser with a "manufactured" wavelength (hereinafter referred to as the laser's "natural" wavelength) below the predefined system range is heated by an amount sufficient to raise its wavelength into the acceptable range. Conversely, a laser with a natural wavelength above the system range is cooled until its wavelength is lowered into the predefined range.

A full and complete understanding of the technique of the present invention is contained in the following description, with reference to the accompanying drawings.

BRIEF DESCRIPTION OF THE DRAWING

Referring now to the drawings, where like numerals represent like parts in several views.

DETAILED DESCRIPTION

Figure 1:
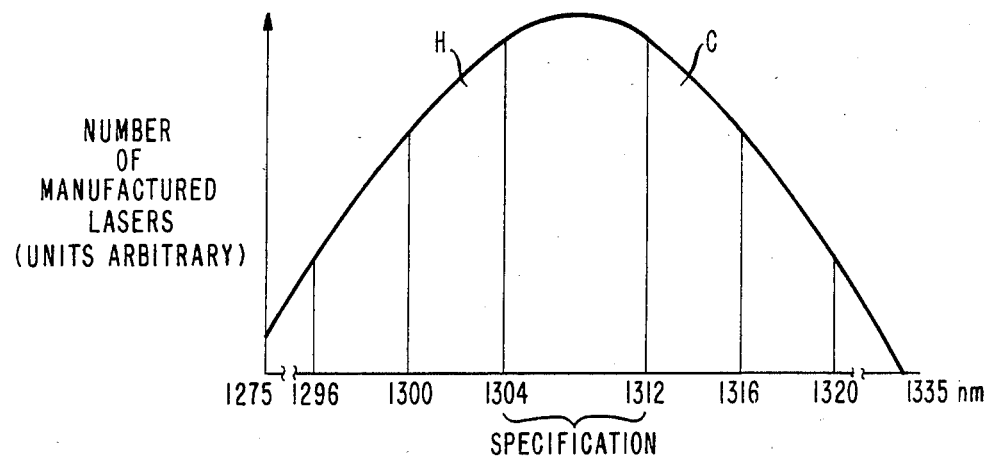
FIG. 1 contains an exemplary graph of the natural wavelength distribution of lasers as manufactured, the predefined system specification being illustrated as a central part of the distribution.

It is proposed to utilize the known relationship between laser wavelength and operating temperature to increase the percentage of lasers which meet a given system specification. Referring to FIG. 1, an exemplary chart illustrating the advantage of the inventive technique is shown. For the following discussion, it will be assumed that an exemplary system will require the use of 1.3 μm InGaAsP lasers, where the system is capable of utilizing lasers over the wavelength range of 1304–1312 nm. The top curve in FIG. 1 is illustrative of an exemplary distribution of natural laser wavelengths extending from 1275 to 1335 nm; that is, the distribution of center wavelengths of the devices at the completion of the fabrication process. As can be seen, a large number of manufactured devices (between 1275–1304 nm and 1312–1335 nm) fall outside of the acceptable 1304–1312 nm range.

According to the inventive technique, the operating temperature of a number of lasers on either side of the system range may be increased or decreased around a standard nominal operating temperature of, for example, 20° C. to raise or lower the laser wavelength to within specification. For example, it is known that the 1.3 μm InGaAsP laser mentioned above typically exhibits a positive temperature dependence of 0.4 nm/°C. Thus, a temperature tuning range of, for example, ±10° C. around the nominal 20° C. would allow those lasers within 4 nm (0.4 nm/°C.×10° C.) of the specification to be heated or cooled to meet the same system specification. In particular, any laser falling within the range of 1300–1304 nm (area H of FIG. 1) may be heated until its center wavelength is at least 1304 nm. The temperature at which this occurs (30° C., for example) is then set as the operating temperature of that particular device. Similarly, any laser within the upper range of 1312–1316 nm (area C of FIG. 1) is cooled until its center wavelength is no more than 1312 nm. Again, the temperature at which this occurs (10° C., for example) is then set as the operating temperature of that particular device. Therefore, each laser with a natural wavelength outside the specification range is individually temperature adjusted to raise or lower its wavelength to within the acceptable limits. This broadened temperature-adjusted range from 1300 to 1316 nm is illustrated in FIG. 1. As is obvious from reference to FIG. 1, a ±10° C. temperature adjustment significantly increases the number of usable lasers from the manufacturing process, where this increase may result in almost twice as many manufactured lasers, for example, meeting the specification.

Obviously, many other temperature ranges may be utilized. For example, a temperature adjustment of ±20° C. results in the utilization of manufactured lasers in the wider spectral range of 1296–1320 nm (±8 nm). Non-symmetrical heating and cooling adjustments may also be used. That is, a given system may use a 10° C. heating range, to provide an additional 4 nm from below the lower limit of the wavelength specification, and a 5° C. cooling range to provide an additional 2 nm from above the upper limit. Additionally, systems may be designed to provide only cooling of lasers which are initially above specification, or only heating of lasers which are initially below specification. It should be noted at this point that the temperature dependence of 0.4 nm/°C. is related only to one particular type of 1.3 μm multi-longitudinal mode InGaAsP device; other lasers are known to exhibit different temperature dependences. For example, a 1.5 μm multi-longitudinal mode InGaAsP laser exhibits a temperature dependence of 0.46 nm/°C., and an exemplary 1.3 μm single mode distributed feedback laser exhibits a dependence of only 0.1 nm/°C.

Since conventional laser-based communication systems are designed to have the laser operate at nominal temperature of, for example, 20° C., the adjustment technique of the present invention merely results in each laser operating at its own designated temperature. Since most of these systems are equipped with temperature control circuitry, this change in temperature requires only a minor circuitry adjustment and does not add significantly to the device or system cost.

Thermoelectric coolers (TE coolers or TECs) are a common means of affecting the operating temperature of a laser. In principle, a TE cooler comprises a parallel plate ceramic structure separated by alternating pillars of p-type and n-type material. A voltage of a first polarity applied across the string of pillars will cause current to flow between the pillars in a given direction. The polarity of the applied signal and the directionality of the current flow will determine whether heat is added to or taken away from the top plate of the parallel plate structure. Therefore, a laser mounted on top of this parallel plate structure may be either heated or cooled, depending on the polarity of the applied signal.

Figure 2:
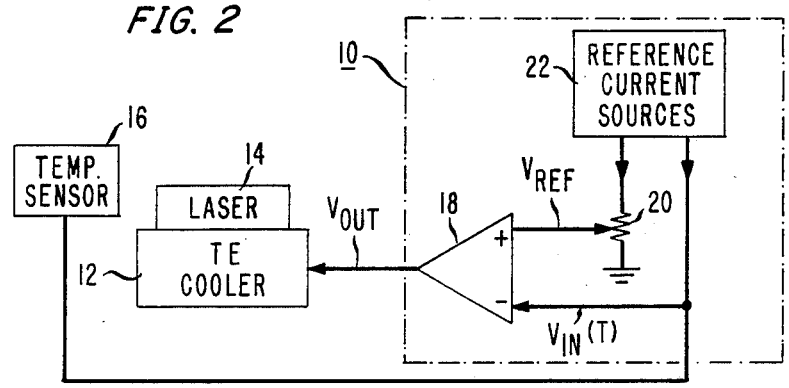
FIG. 2 illustrates, in block diagram form, an exemplary arrangement which may be utilized to implement the temperature wavelength adjustment technique of the present invention.

FIG. 2 illustrates, in block diagram form, an exemplary control circuit 10 which may be utilized in conjunction with a TE cooler 12 to provide the temperature/wavelength adjustment to a laser 14 in accordance with invention. The input signal to circuit 10 may be either a current or voltage signal from a temperature-sensitive device 16 (e.g., an integrated circuit temperature sensor or a thermistor), mounted in close proximity to laser 14. Since the output signal from a temperature sensor is necessarily a function of temperature, the input signal to circuit 10 (here shown as a voltage signal $V_{IN}(T)$) will be indicative of the ambient temperature of the laser. Referring to FIG. 2, input signal $V_{IN}(T)$ is compared in a differential amplifier 18 to an adjustable voltage $V_{REF}$ generated in a potentiometer 20 coupled to a reference current source 22. Any significant difference in magnitude between $V_{IN}(T)$ and $V_{REF}$ results in an output control signal $V_{OUT}$ being transmitted back to TE cooler 12. For example, a negative polarity signal $V_{OUT}$ (indicating $V_{IN}(T) > V_{REF}$) may be sent if cooling is required. Alternatively, a positive signal $V_{OUT}$ would be transmitted if additional heating were required. The magnitude of $V_{OUT}$ is indicative of the amount of either heating or cooling required. As shown in FIG. 2, the standard current $I_{REF}$ from current source 22 generates a voltage across potentiometer 20. Therefore, by adjusting the resistance value of potentiometer 20, the resultant magnitude of $V_{REF}$ may be either increased, or decreased, as desired, to provide the required degree of heating or cooling, respectively.

In accordance with the teachings of the present invention, all lasers are tested prior to installation to ascertain their natural center wavelength. Those lasers within the system specification, as well as those which may be either heated (area H) or cooled (area C) to meet the specification, are then installed, with an indication as to the proper setting required for potentiometer 20 to generate the $V_{REF}$ desired for the operating temperature of the particular device.

The teachings of temperature tuning in accordance with the present invention may also be utilized to increase the percentage yield of lasers utilized in wavelength division multiplexed (WDM) systems. WDM is an attractive alternative technique for increasing the capacity of an installed communication system in that more than one message signal may be transmitted simultaneously over a single fiber by utilizing lightwave carrier signals with different center wavelengths. At the receiving end of the system, these different message channels must be separated utilizing known filtering techniques. WDM also increases the effective system bit rate while enabling the associated electronics to operate at a low bit rate—an important feature in high bit rate systems which push the electronics to the limits of their capabilities.

Figure 3:
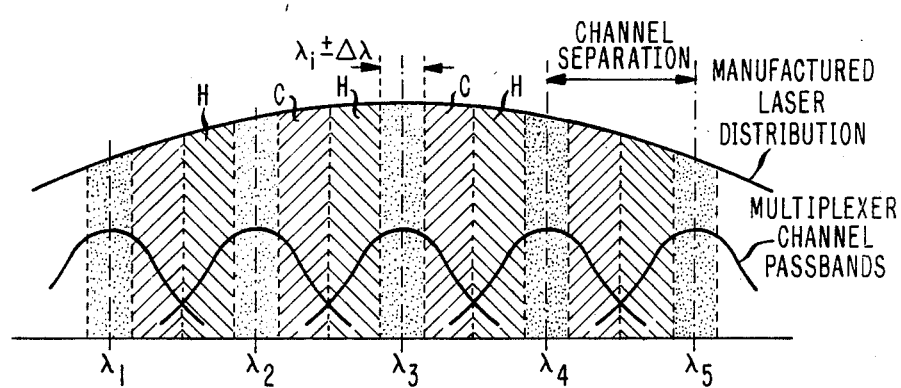
FIG. 3 illustrates the wavelength distribution for an exemplary WDM system, including an illustration of the utilization of the inventive temperature tuning technique to increase the number of lasers which may be used in such a system.

In conventional WDM receivers, there exists a problem in separating the different message channels without causing undue crosstalk. This problem is known to increase with the number of channels, and is strongly dependent on the ability of the system to control the center wavelength of the lasers utilized with each message channel. Thus, in accordance with the present invention, temperature tuning may be utilized to increase the number of lasers with a center wavelength very near the center wavelength of each channel. This technique is illustrated in FIG. 3. As with FIG. 1, FIG. 3 illustrates an exemplary manufactured distribution of laser center wavelengths. For this particular WDM system, it is desired to utilize five message channels, operating at center wavelengths $\lambda_1 - \lambda_5$, as shown. At an associated WDM receiver (not shown), a set of five channel dropping filters (notch filters) would be used to recover the separate message signals.

In the prior art, crosstalk between adjacent multiplexer channel passbands could be minimized by utilizing only those transmitters with lasers having a natural (manufactured) center wavelength within the range of $\lambda_i \pm \Delta\lambda$ (i=1, 2, 3, 4, 5) as shown in the dotted regions of FIG. 3. This may only be a small percentage of the total distribution of manufactured lasers since the factor $2\Delta\lambda$ is significantly smaller than the channel separation. Therefore, the temperature tuning technique of the present invention may be utilized to increase the number of lasers which fall into this desired range around each center wavelength. In particular, lasers within a first region $\lambda_H < \lambda_i - \Delta\lambda$ (indicated by the letter "H" in FIG. 3) may be heated until their center wavelength is at least $\lambda_i - \Delta\lambda$. Similarly, those lasers within a second region $\lambda_C > \lambda_i + \Delta\lambda$ (denoted "C" in FIG. 3) may be cooled until their center wavelength is at most $\lambda_i + \Delta\lambda$. As with the attributes of the present invention discussed above, a WDM system employing this temperature tuning technique may utilize any combination of heating and/or cooling to increase the number of usable lasers for a particular transmitting wavelength.

What is claimed is:

1. A method of manufacturing laser transmitters to meet a predefined wavelength specification of $\lambda_o \pm \Delta\lambda$, comprising the following steps performed prior to installation of the transmitters in a communication system:
    (a) providing a plurality of semiconductor lasers which have a distribution of natural wavelengths which exceed the specification $\lambda_o \pm \Delta\lambda$;
    (b) installing the lasers in control circuits which enable the operating temperature of the lasers to be changed;
    (c) operating the lasers in the control circuits to identify those lasers which fall within a first band below the specification and those which fall within a second band above the specification;
    (d) adjusting the control circuits of those lasers which fall within the first band so as to heat the lasers until the operating wavelengths are within the specification; and
    (e) adjusting the control circuits of those lasers which fall within the second band so as to cool the lasers until the operating wavelengths are within the specification,
    wherein in performing steps (d) and (e), thermoelectric means are utilized to head and cool the lasers and the following steps are performed:
        (1) providing from the control circuit an output signal of a known polarity ($V_{out}$) to the thermoelectric means, the output signal being of a first polarity when heating is desired and a second, opposite polarity when cooling is desired; and
        (2) adjusting the magnitude of said output signal to provide the required heating and cooling of steps (d) and (e).

2. The method of claim 1 wherein, in performing step (2), the output signal is supplied by an amplifier, the magnitude being adjusted by changing a resistance value at the amplifier input.

3. A method of increasing the percentage yield of manufactured laser transmitters meeting a predefined wavelength specification of $\lambda_o \pm \Delta\lambda$, comprising the following steps:
    (a) providing a plurality of semiconductor lasers which have a distribution of natural wavelengths which exceed the specification $\lambda_o \pm \Delta\lambda$;
    (b) installing the lasers in control circuits which enable the operating temperature of the lasers to be changed;
    (c) operating the lasers in the control circuits to identify those lasers which fall within a first band below the specification and those which fall within a second band above the specification;
    (d) adjusting the control circuits of those lasers which fall within the first band so as to heat the lasers until the operating wavelengths are within the specification;
    (e) adjusting the control circuits of those lasers which fall within the second band so as to cool the lasers until the operating wavelengths are within the specification; and
    (f) installing lasers with associated adjusted control circuits in communication systems,
    wherein in performing steps (d) and (e), thermoelectric means are utilized to heat and cool the lasers and the following steps are performed:
        (1) providing from the control circuit an output signal ($V_{out}$) of a known polarity to the thermoelectric means, the output signal being of a first polarity when heating is desired and a second, opposite polarity when cooling is desired; and
        (2) adjusting the magnitude of said output signal to provide the required heating and cooling of steps (d) and (e).

4. The method of claim 3 wherein, in performing step (2), the output signal is supplied by an amplifier, the magnitude being adjusted by changing a resistance value at the amplifier input.

5. A method of manufacturing laser transmitters, which includes adjusting the manufactured wavelength of a semiconductor laser so as to provide operation of said laser transmitters within a predetermined spectral range of $\lambda_o \pm \Delta\lambda$, the method comprising the following steps performed prior to the installation of said laser transmitter in a system:
  (a) comparing the manufactured transmitting wavelength $\lambda$ to the predetermined limits $\lambda_o - \Delta\lambda$ and $\lambda_o + \Delta\lambda$;
  (b) increasing the operating temperature of said semiconductor laser if said manufactured transmitting wavelength $\lambda_1$ is less than $\lambda_0 - \Delta\lambda$ until the transmitting wavelength is at least $\lambda_o - \Delta\lambda$; and
  (c) decreasing the operating temperature of said semiconductor laser if said manufactured transmitting wavelength $\lambda$ is greater than $\lambda_o + \Delta\lambda$ until the transmitting wavelength is at most $\lambda_o + \Delta\lambda$,
  wherein in performing steps (b) and (c), thermoelectric means are utilized to adjust the semiconductor laser operating temperature and the following steps are performed:
    (1) providing an output signal ($V_{out}$) to the thermoelectric means the output signal being of a first polarity when hearing is desired and a second, opposite polarity when cooling is desired; and
    (2) adjusting the magnitude of said output signal to provide the required heating and cooling of steps (b) and (c).

6. The method of claim 5 wherein, in performing step (2), the output signal is supplied by an amplifier, the magnitude being adjusted by changing a resistance value at the amplifier.

* * * * *